United States Patent [19]

Parker, Jr.

[11] Patent Number: 5,110,036
[45] Date of Patent: May 5, 1992

[54] METHOD AND APPARATUS FOR SOLDER LEVELING OF PRINTED CIRCUIT BOARDS

[75] Inventor: John L. Parker, Jr., Sandston, Va.

[73] Assignee: AT&T Bell Laboratories, Murray Hill, N.J.

[21] Appl. No.: 628,789

[22] Filed: Dec. 17, 1990

[51] Int. Cl.⁵ .................................. B08B 3/02
[52] U.S. Cl. ........................... 228/256; 228/20
[58] Field of Search ............. 228/256, 259, 20 R, 228/40, 20 HT; 427/344, 378, 96, 97

[56] References Cited

U.S. PATENT DOCUMENTS

| | | | |
|---|---|---|---|
| 3,661,315 | 5/1972 | Hilton | 228/20 HT |
| 3,865,298 | 2/1975 | Allen et al. | 228/20 R |
| 4,356,840 | 11/1982 | Friedland et al. | |
| 4,578,102 | 3/1986 | Colmon et al. | |
| 4,619,841 | 10/1986 | Schwerin | 228/20 R |
| 4,776,731 | 10/1988 | Briggs et al. | |
| 4,847,043 | 7/1989 | Gluntz | |
| 4,958,052 | 9/1990 | Mahieu | |
| 4,995,411 | 2/1991 | Lowell et al. | 228/20 R |

FOREIGN PATENT DOCUMENTS 0058042   5/1977   Japan ........................ 228/20 R Primary Examiner—Richard K. Seidel
Assistant Examiner—James Miner
Attorney, Agent, or Firm—L. H. Birnbaum

[57] ABSTRACT

Disclosed is a method and apparatus for fabricating workpieces such as printed circuit boards which include blowing excess solder off the board by a hot air solder leveling technique. A converging/diverging airknife design creates a shock wave, causing a high pressure, low velocity flow pattern which removes solder from the through-holes in the board while leaving sufficient solder on the surface mount features. Additionally, a Mach number of the fluid of less than 0.8 is created.

7 Claims, 2 Drawing Sheets

METHOD AND APPARATUS FOR SOLDER LEVELING OF PRINTED CIRCUIT BOARDS

BACKGROUND OF THE INVENTION

This invention relates to fabricating workpieces, such as printed circuit boards, and in particular to providing an appropriate amount of solder at desired locations.

In a typical circuit board fabrication sequence, once the conductive features are formed, solder must be applied to the bonding pads to permit bonding of IC devices. One popular approach is to dip the board in molten solder and then remove excess solder by directing hot air at the board surfaces as they emerge from the solder bath. This technique is referred to as Hot Air Solder Leveling (HASL).

FIG. 1 illustrates a portion of a typical printed circuit board, 10, which includes a plurality of bonding pads, e.g., 11, for bonding thereto a semiconductor integrated circuit device (not shown). Conductive lines, e.g., 12, are also defined on the board in order to electrically couple the pads to other portions of the circuit. The circuit board also includes through-holes, e.g., 13, to provide electrical connection between conductors on the front and back surfaces of the board.

Most present HASL systems were designed for the old style circuit boards which utilized through-holes for attaching components rather than the solder mount pads (11) which are prevalent today. Consequently, present systems tend to leave a thin and/or uneven layer of solder on the pads which can result in costly defects in the final board. Merely reducing the pressure of the air is not generally effective since solder will not be cleared from the through-holes (13) which remain on the board.

It is, therefore, an object of the invention to provide printed circuit boards with the right amount of solder at surface mount and through-hole features.

Summary of the Invention

This and other objects are achieved in accordance with the invention which, in one aspect, is a method of fabricating a printed circuit board comprising the step of inserting the board into a bath of solder. As the board is removed from the bath, a fluid flow is directed toward at least one surface. The fluid is forced through a nozzle so as to create a shock wave within a portion of the nozzle.

In accordance with another aspect, the invention is an apparatus for removing excess solder from a board comprising at least one nozzle assembly for directing a fluid toward a surface of the board. The nozzle assembly comprises means for delivering the fluid to the nozzle and a nozzle head which converges to an opening removed from the delivery means and then diverges at a certain angle from said opening to create a shock wave for fluid passing through said opening.

BRIEF DESCRIPTION OF THE DRAWING

These and other features of the invention are delineated in detail in the following description. In the drawing.

It will be appreciated that, for purposes of illustration, these figures are not necessarily drawn to scale.

DETAILED DESCRIPTION

Figure 1:
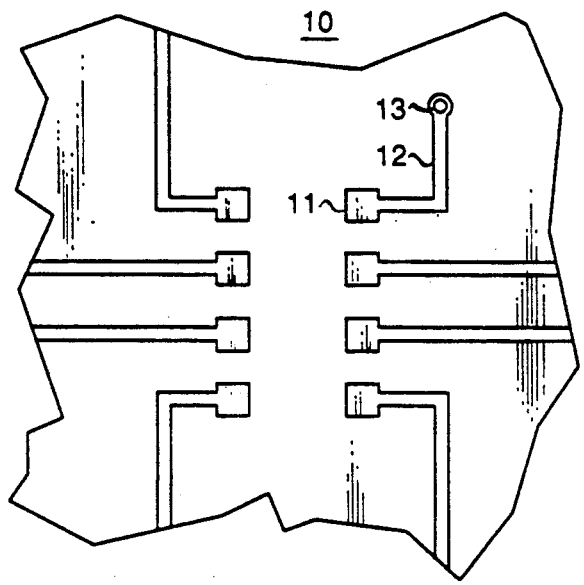
FIG. 1 is a plan view of a portion of a printed circuit board in accordance with the prior art which can utilize the invention.
Figure 2:
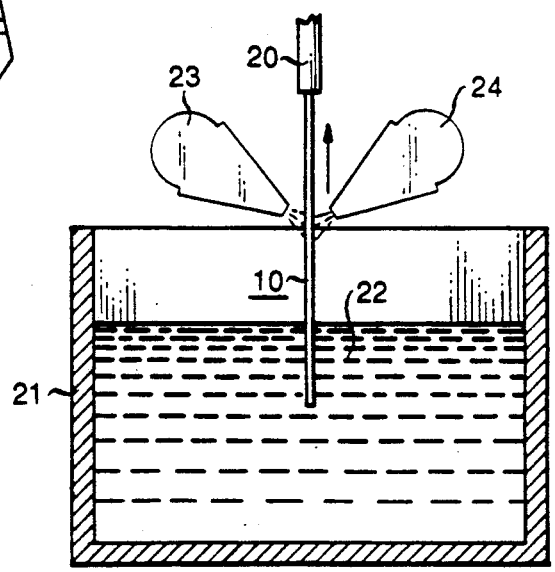
FIG. 2 is a schematic view of apparatus for practicing the invention in accordance with one embodiment.

Once the conductors and surface mount pads are formed on the printed circuit board (see FIG. 1), a mask (not shown) is formed over essentially the entire major surfaces of the board leaving exposed the areas to be soldered. The board is then ready for soldering as illustrated schematically in FIG. 2. The board, 10, is held by an appropriate fixture, 20, and completely immersed in a reservoir 21 containing a molten solder bath 22. The solder is typically a lead-tin alloy held at a temperature of approximately 500° F. The board is usually immersed for approximately 2-5 seconds. As the board is removed from the bath, it passes between a pair of nozzles, 23 and 24, which direct a stream of hot air at respective surfaces of the board to remove excess solder. In a typical prior art process, the air had a high stagnation pressure (usually approximately 2 kg/cm$^2$) and a high velocity (approximately 500 meters/sec). In accordance with a main feature of the invention, the stagnation pressure characteristic is maintained. However, the velocity of the air as it exits the nozzles is considerably reduced in a manner to be described. Desirably, the velocity is less than 200 meters/sec. The resulting air flow pattern is sufficient to remove solder from the through-holes, but in a manner which keeps a thick, even coating of solder in the interior of the surface mount pads, i.e., a thickness of at least 2.5 microns. While FIG. 2 illustrates a system where the boards are inserted vertically into the solder, it will be appreciated that other systems transport the boards horizontally through a bath, and upon emerging, the boards are subject to air jets from nozzles above and below the boards. The invention described herein is applicable to either horizontal or vertical systems.

Figure 4:
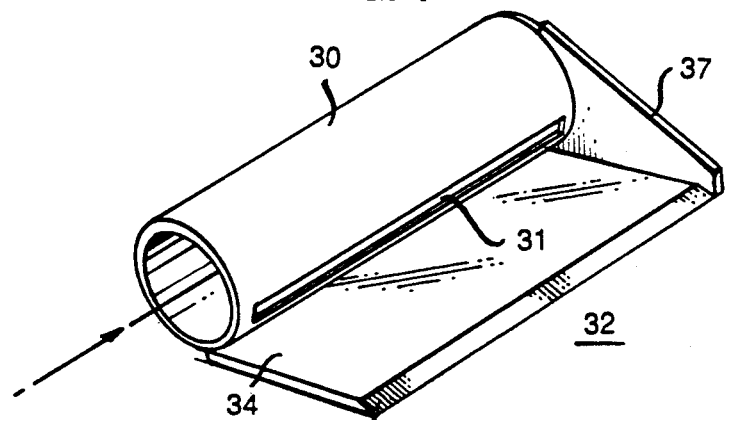
FIG. 4 is an elevated perspective view, partly cut away, of the nozzle assembly of FIG. 3.
Figure 3:
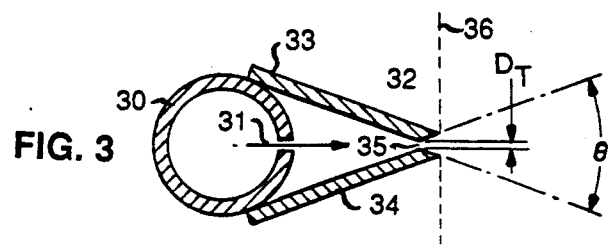
FIG. 3 is a more detailed cross-sectional view of a nozzle assembly in accordance with an embodiment of the invention.

FIGS. 3 and 4 illustrate a design for a nozzle assembly which is effective in producing the desired results. A cylindrical pipe or tube, 30, delivers the hot air from a standard heat exchanger (not shown) where it has been heated, typically, to a temperature of 240° C. In this example, the pipe is made of stainless steel and has a diameter of approximately 2.5 cm. The pipe includes a longitudinal slit, 31, extending the length of the nozzle head 32 for escape of the air into the head. The slit is, typically, 0.75 cm wide.

The head, 32, includes a pair of plate elements, 33 and 34, with a length extending essentially the full length of the board, i.e., approximately 0.75 meters. One end of each plate is mounted on the surface of the pipe, 30, in a diametrically opposed relationship. The plates converge at an area removed from the pipe 30 a distance of approximately 15-20 cm so as to form a longitudinal opening, or throat, 35 for the escape of the air from the nozzle. The edges of the nozzle past the throat 35 are beveled so as to produce a desired angle, Θ, between the plates 33 and 34. Side panels are also coupled to the edges of the plates and pipe to prevent escape of air parallel to the pipe 30, one of said panels being shown as element 37 in FIG. 4.

With such a nozzle design, the air forced through the slit 31 of the pipe 30 will experience a converging space up until the throat 35 and then a diverging space beyond the throat 35. As the pressure of the air increases, the flow in the nozzle will accelerate until the flow at the throat becomes sonic. Further increases in pressure do not change the Mach number anywhere in the converging portion or at the throat of the nozzle. (Hence, in prior art nozzles, the air flow would usually be at approximately Mach 1 regardless of the pressure.) At the diverging portion, however, the flow will become supersonic if the flow at the opening is sonic since the fluid will accelerate as it expands. The fluid must also exit the diverging portion of the nozzle (at the exit plane indicated by line 36) at atmospheric pressure. The only way for this to be achieved in a supersonic flow is by an abrupt change in entropy in the diverging portion of the nozzle, i.e., a shock wave is formed. Across the shock wave, the flow decelerates from supersonic to subsonic. Thus, the desired characteristics of high stagnation pressure, but low velocity, are achieved as the air exits the nozzle at the exit plane indicated by line 36.

Consequently, with an appropriate choice of the angle, $\Theta$, in relationship to the stagnation pressure of the air, a shock wave can be formed as the air exits throat 35. The shock wave will result in a greatly reduced air velocity at the nozzle exit (a Mach number of less than 0.8 which for air is less than 200 meters/sec) which is suited for maintaining a proper solder thickness on the surface mount pads on the board.

In this particular example, with a stagnation pressure of 2 kg/cm$^2$ absolute, an angle, $\Theta$, of approximately 14 degrees produced the desired shock wave. However, it should be understood that since the angle employed to achieve a shock wave is primarily dependent upon the stagnation pressure of the fluid, other angles may be employed. In general, it is expected that for solder leveling, divergent angles will fall within the range 10-25 degrees, and stagnation pressures will fall within the range 1.5-3.0 kg/cm$^2$ absolute.

In choosing an appropriate nozzle design, several factors should be considered. The shock wave should be generated in the diverging portion of the nozzle rather than beyond the exit plane, otherwise the shock wave could be unstable. Further, the mass flow should be reasonable with regard to the heater capacity of present Hot Air Solder Leveling apparatus. Also, a large opening is preferable to avoid clogging. As the opening increases, the mass flow will also increase. However, as the mass flow increases, it becomes more difficult to heat the air to the desired temperature (usually 220°-270° C).

Consequently, it is generally desirable to keep the throat dimension, $D_T$, to less than 0.3 cm. To develop the desired flow pattern, the exit area should be several times larger than the throat area. At the same time, to avoid clogging, the exit opening should be at least 2.5 cm. Further, a stagnation pressure of at least 2 kg/cm$^2$ absolute is desirable to insure solder removal from the holes in the printed circuit boards.

Figure 5:
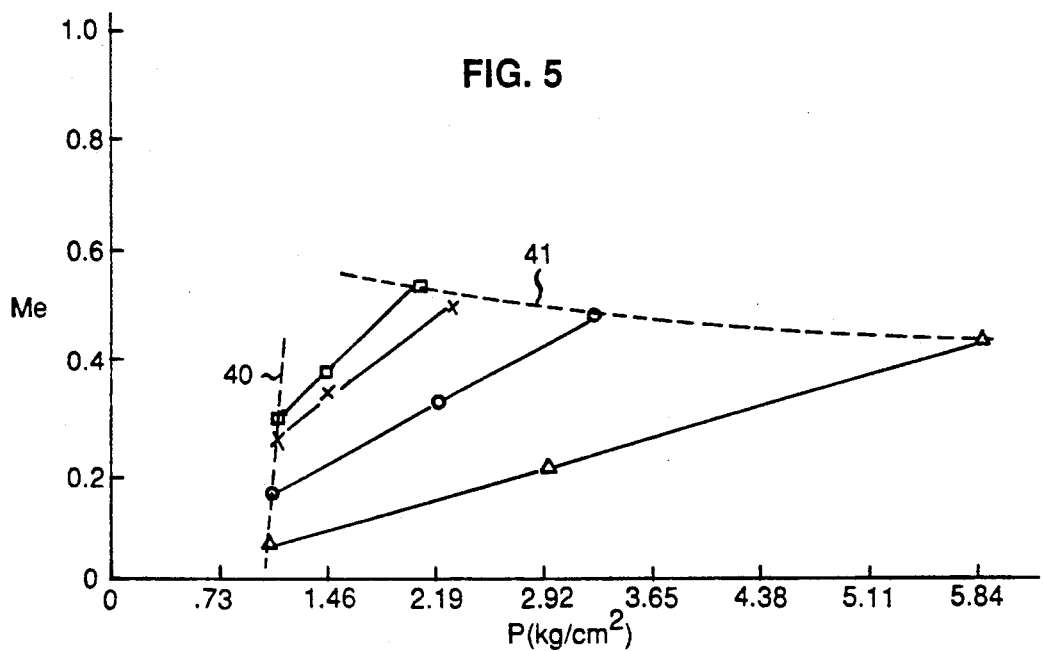
FIG. 5 is a graph of Mach number as a function of stagnation pressure for various apparatus in accordance with the invention.
Figure 6:
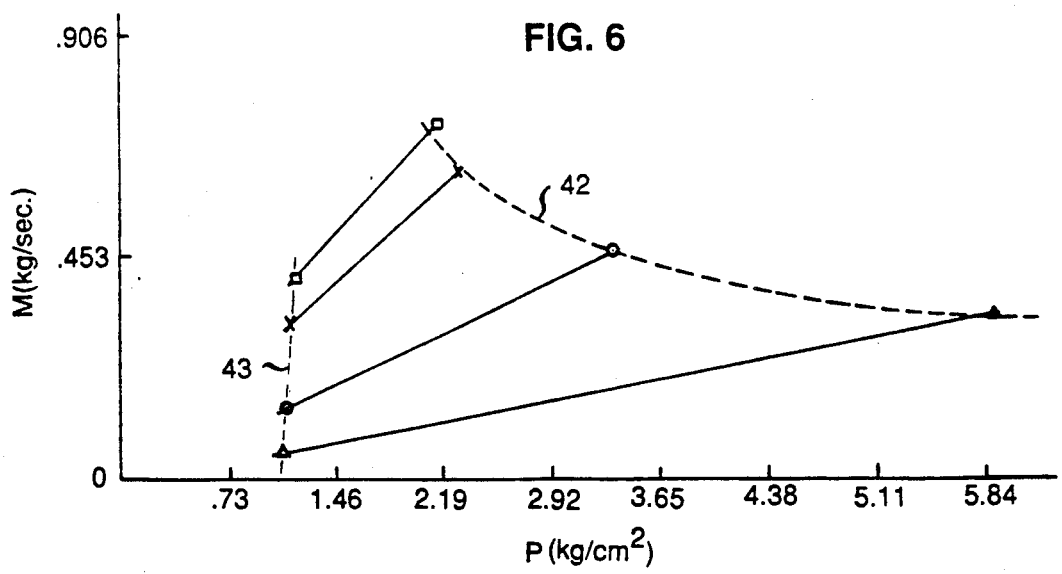
FIG. 6 is a graph of mass flow as a function of stagnation pressure in accordance with the same embodiments.

FIGS. 5 and 6 illustrate important parameters in the design of the nozzle. Both assume an angle, $\Theta$, of approximately 14 degrees, but it will be appreciated that a family of curves can be generated for other angles as well. The graphs are plotted for various throat dimensions ($D_T$ of FIG. 3). The symbol "X" designates a dimension of 0.254 cm, the symbol "□" designates a dimension of 0.318 cm, the symbol "0" designates a dimension of 0.128 cm, and the symbol "Δ" designates a dimension of 0.05 cm.

FIG. 5 is a graph of the Mach number ($M_e$) of the air at the exit plane of the nozzle as a function of stagnation pressure P. To the left of the dashed line labeled 40, no shock wave will form. Above the dashed line labeled 41, a shock wave will be produced, but outsize the nozzle area (to the right of the exit plane labeled 36 in FIG. 3). Thus, it is desirable to choose a throat dimension for a particular pressure which will fall within the boundaries of those two lines.

FIG. 6 is a graph of the mass flow M as a function of stagnation pressure, P. Again, no shock wave is formed to the left of dashed line 43 and the shock wave above line 42 will form outside the nozzle. It will be appreciated that the throat dimension should be such as to keep the mass flow sufficiently small at the desired pressure to permit efficient heating of the air. In a typical solder leveling apparatus, it is usually desirable to keep the mass flow below 0.453 kg/sec (1 lb/sec). Thus, for example, at a pressure of 2.19 kg/cm$^2$ (30 PSI), a throat dimension of 0.128 cm was chosen, but openings in the range 0.05-0.3 cm would be appropriate.

In the present examples, a ratio of the exit area (at plane 36) to throat area (at slit 35) of approximately 2 to 1 was assumed with the length of the diverging portion being approximately 0.5 cm. Of course, other values may be chosen for particular needs.

Various additional modifications of the invention will become apparent to those skilled in the art. For example, although air was used as the fluid, other fluids may be employed. All such variations which basically rely on the teachings through which the invention has advanced the art are properly considered within the scope of the invention.

I claim:

1. A method of fabricating a printed circuit board having two major surfaces comprising the steps of:
    inserting the board into a bath of solder; and
    as the board is removed from said bath, directing toward at least one surface a fluid flow through a nozzle so as to create a shock wave within the nozzle and a Mach number of the fluid at the exit of the nozzle of less than 0.8.

2. The method according to claim 1 wherein the fluid is air.

3. The method according to claim 2 wherein the air is heated to a temperature in the range of 220°-270° C.

4. The method according to claim 1 wherein the stagnation pressure of the fluid is within the range of 1.5-3.0 kg/cm$^2$.

5. The method according to claim 1 wherein the fluid is directed through a nozzle head which converges to an opening and then diverges at a specified angle from the opening and adjacent to the atmosphere to create the shock wave.

6. The method according to claim 5 wherein the shock wave is generated in the diverging portion of the nozzle.

7. The method according to claim 1 wherein fluid is directed to both major surfaces of the board simultaneously.

* * * * *